(12) United States Patent
Elenius et al.

(10) Patent No.: US 7,118,833 B2
(45) Date of Patent: Oct. 10, 2006

(54) FORMING PARTIAL-DEPTH FEATURES IN POLYMER FILM

(75) Inventors: Peter Elenius, Scottsdale, AZ (US); Michael E. Johnson, Tempe, AZ (US)

(73) Assignee: FlipChip International, LLC, Phoenix, AZ (US)

( * ) Notice: Subject to any disclaimer, the term of this patent is extended or adjusted under 35 U.S.C. 154(b) by 170 days.

(21) Appl. No.: 10/672,201

(22) Filed: Sep. 26, 2003

(65) Prior Publication Data

US 2005/0069782 A1    Mar. 31, 2005

(51) Int. Cl.
*G03F 9/00*    (2006.01)
*G03C 5/00*    (2006.01)
(52) U.S. Cl. .......................... 430/5; 430/311; 430/396
(58) Field of Classification Search ................ 430/5, 430/396, 311
See application file for complete search history.

(56) References Cited

U.S. PATENT DOCUMENTS

| | | | | |
|---|---|---|---|---|
| 5,585,210 | A | * 12/1996 | Lee et al. | 430/5 |
| 5,725,973 | A | * 3/1998 | Han et al. | 430/5 |
| 6,287,893 | B1 | 9/2001 | Elenius et al. | 438/108 |
| 6,362,112 | B1 | 3/2002 | Hamerski | 438/737 |
| 6,437,434 | B1 | 8/2002 | Sugizaki | 257/692 |
| 6,465,811 | B1 | 10/2002 | Peters et al. | 257/99 |
| 6,548,897 | B1 | 4/2003 | Grigg | 257/737 |
| 6,578,755 | B1 | 6/2003 | Elenius et al. | 228/254 |
| 2002/0195662 | A1 | 12/2002 | Eden et al. | 257/349 |
| 2003/0008221 | A1 | 1/2003 | Tsai et al. | 430/5 |

\* cited by examiner

*Primary Examiner*—Christopher G. Young
(74) *Attorney, Agent, or Firm*—Greenberg Traurig LLP; Charles Berman, Esq.; Bruce T. Neel, Esq.

(57) ABSTRACT

A photomask (1900) for producing partial-depth features (712 and 912) in a photo-imageable polymer layer (412) on a wafer of a chip scale package (200) using exposure tools capable of resolving sizes of a critical dimension or larger, has a plurality of chrome lines (2101–2103). Each chrome line has a width (2105) that is less than the critical dimension, and each chrome line of the plurality of chrome lines is spaced apart less than the critical dimension. The plurality of chrome lines produces a single partial-depth feature, such as a via, through part of a thickness of the polymer layer. Alternatively, the photomask has a plurality of chrome circles (2206), each chrome circle having a diameter less than the critical dimension and being spaced apart less than the critical dimension, which produces the partial-depth feature. The photomask may also have chrome of width greater than the critical dimension and spaced from other chrome by a distance greater than the critical dimension, which produces a full-depth feature through the entire thickness of the polymer film. The partial-depth feature and the full-depth feature are produced substantially simultaneously during a single series of photo-imaging steps. By preselecting a size, shape and distance between the chrome, the photomask is capable of inscribing discernable markings on the polymer layer, of changing the thickness of the polymer layer, and of changing an optical property of the surface of the polymer layer.

26 Claims, 13 Drawing Sheets

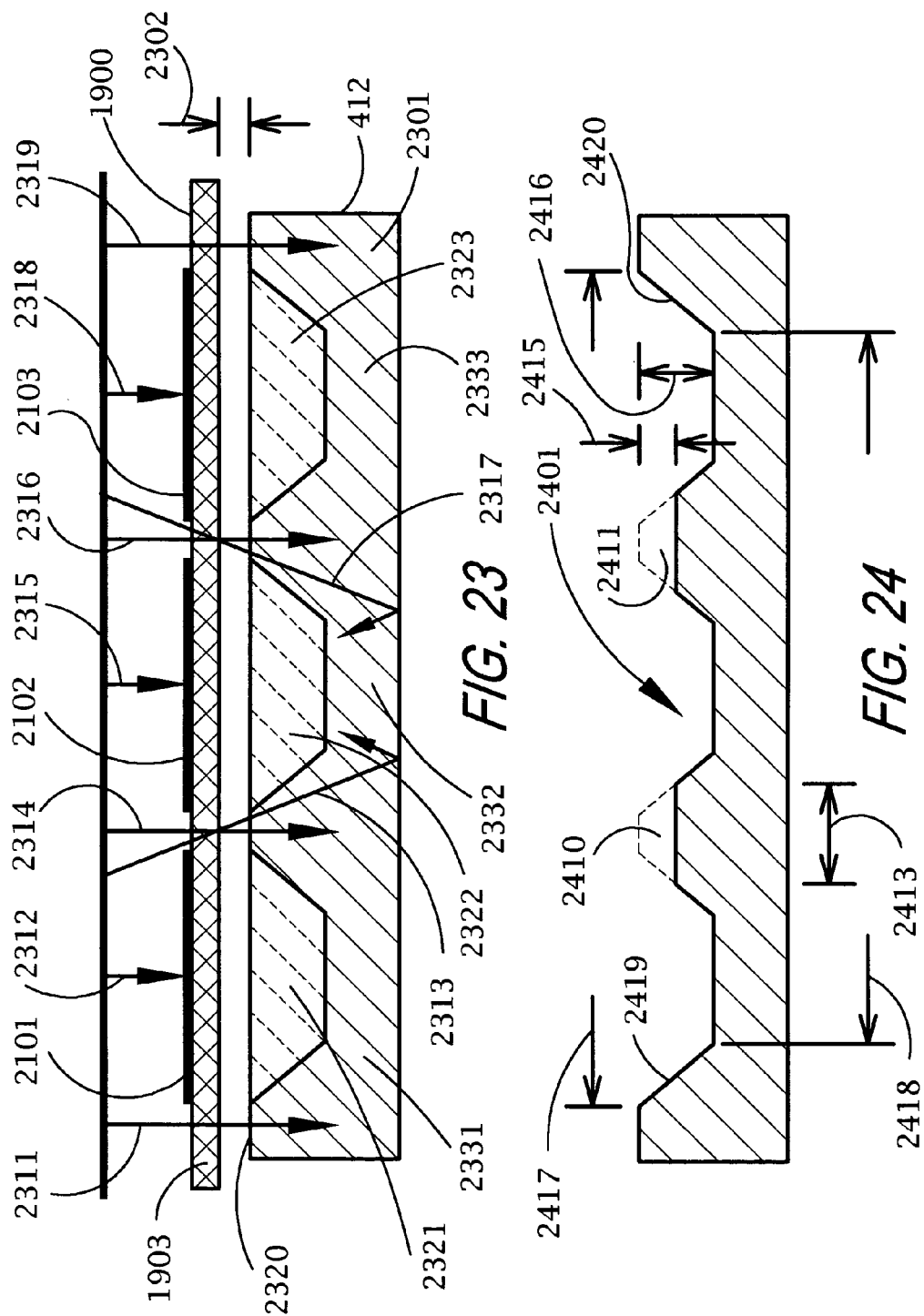

FORMING PARTIAL-DEPTH FEATURES IN POLYMER FILM

RELATED APPLICATION

This application is related to application having Ser. No. 10/672,165 entitled WAFER-LEVEL MOAT STRUCTURES, filed on even date with this application, assigned to the same assignee as the assignee of this application, which is hereby fully incorporated herein by reference.

BACKGROUND OF THE INVENTION

1. Field of the Invention

This invention relates generally to imaging in a photo-imageable polymer film on a semiconductor wafer, and more particularly to forming a structural feature, for example, a via, partially through a thickness of the polymer film.

2. Description of the Related Art

A wafer-level chip scale package (CSP) is a package for an integrated circuit that is substantially the size of the integrated circuit or of a flip chip, which uses a wafer-level processing technique. Unlike a flip chip, the wafer-level CSP has one or more passivation layers on the active side of the die. Each passivation layer typically comprises a layer of photo-imageable polymer film. The wafer-level CSP is smaller than a standard ball grid array (BGA), typically uses metal traces of a re-distribution layer (RDL) to route solder ball pads to standard pitches, and uses CSP-size solder balls on the re-routed pads. A wafer-level CSP uses a standard surface mount technology assembly process that is also used for BGAs, and does not require underfill.

When a polymer film is imaged, it is generally desired that a structural feature, such as a via or a hole, is achieved through the entire film thickness, or layer. All photo-imageable polymer film systems and processes, have some minimum size, or critical dimension, for example, ten (10) microns, that is resolvable to open the structural feature, or feature, completely through the layer. Assuming that the layer is in an x-y plane of an x-y-z coordinate system, a depth of the feature is in the z direction. A structural feature that penetrates completely through the layer of polymer film is a full-depth feature. To make a full-depth feature, the smaller of the dimensions of the feature in the x-y plane, must be larger than the critical dimension. A feature in which the smaller of the dimensions of the feature in the x-y plane is smaller than the critical dimension, is a partial-depth feature and does not penetrate completely through the layer.

The critical dimension is determined by many factors including the type of material comprising the layer, the thickness of the layer, the exposure tool used, several exposure process parameters such as exposure energy, exposure time and depth of focus, and several developing process parameters such as the developing solution, temperature and time.

A photomask, which comprises a UV light-blocking material, such as chrome, disposed on a transparent glass or quartz plate, is used to expose a polymer film. A prior art photomask has chrome disposed in patterns that have a shape and size of the features that are desired to be produced in the polymer film. In the case of a negative acting polymer film, polymer film exposed to light becomes cross-linked and cannot be developed, i.e., removed, from the exposed area. In the case of a positive acting film, the polymer film exposed to light is removed during development.

Using prior art methods, a partial-depth feature in which its smaller dimension is greater than the critical dimension cannot be formed in a polymer film at the same time, i.e., during a single series of photo-imaging steps using one photomask, as a full-depth feature is formed.

OBJECTS OF THE INVENTION

It is therefore an object of the present invention to overcome the disadvantages of the prior art. In particular, it is an object of the present invention to provide a photomask with which a full-depth feature and a partial-depth feature can substantially simultaneously be produced in a polymer film.

It is another object of the present invention to provide a method of forming a full-depth feature and a partial-depth feature substantially simultaneously in a polymer film.

It is still another object of the present invention to provide a method of reducing the reflectivity of a surface of the polymer layer.

It is yet another object of the present invention to provide a method of marking information on the surface of the polymer layer.

It is a further object of the present invention to provide a method to thin a polymer layer.

These and other objects of the present invention will become apparent to those skilled in the art as the description thereof proceeds.

SUMMARY OF THE INVENTION

Briefly described, and in accordance with a preferred embodiment thereof, the present invention relates to a photomask used to form a partial-depth feature in a polymer film on a semiconductor wafer, and, substantially simultaneously, used to form a full-depth feature in the polymer film on the semiconductor wafer during one series of photo-imaging steps using exposure tools that are capable of resolving a minimum resolvable size to form a feature completely through the polymer film. The polymer film has a film thickness, and the partial-depth feature has a depth substantially less than the film thickness. The full-depth feature has a depth approximately equal to the film thickness. The photomask includes a transparent plate and at least one full-depth producing pattern. Each full-depth producing pattern includes an area of UV light-blocking material disposed on the transparent plate. The area has a larger dimension and a smaller dimension, and the smaller dimension is equal to or greater than minimum resolvable size. The photomask also includes a partial-depth producing pattern that includes a plurality of areas of UV light-blocking material disposed on the transparent plate. Each area of the plurality of areas has a larger dimension and a smaller dimension, and the smaller dimension is less than the minimum resolvable size, and each area is spaced from another area by a distance less than the minimum resolvable size.

Preferably, the partial-depth producing pattern produces only one partial-depth feature in the polymer film.

Another aspect of the present invention relates to a method of forming a partial-depth feature in a polymer film on a semiconductor wafer using exposure tools that have a critical dimension, which includes the steps of: (a) disposing on a photomask a partial-depth producing pattern that includes a plurality of areas of UV light-blocking material, in which each area has a smaller dimension less than the critical dimension and is spaced apart a distance less than the critical dimension; and (b) exposing the polymer film to the partial-depth producing pattern on the photomask in a manner substantially the same as when exposing the polymer film to full-depth producing images on the photomask; and (c) developing the polymer film exposed to the partial-depth producing pattern on the photomask in a manner substantially the same as when developing the polymer film exposed to a full-depth producing pattern on the photomask.

A further aspect of the invention relates to a method of altering an optical property of a surface of a polymer film, which includes the steps of (a) disposing a layer of polymer film on a semiconductor wafer, in which the layer has a surface with a first optical property; (b) exposing the polymer film to a partial-depth producing pattern on a photomask; and (b) developing the exposed polymer film such that the surface of the polymer film has a second optical property.

Yet another aspect of the invention relates to a method to inscribe markings on a surface of a polymer film, which includes the steps of: (a) disposing a layer of polymer film on a semiconductor wafer, in which the layer has a surface with no discernable markings; (b) exposing the polymer film to a partial-depth producing pattern on a photomask, in which the partial-depth producing pattern has one or more preselected shapes; and (b) developing the exposed polymer film such that the one or more preselected shapes are discernable on the surface of the polymer film.

Still another aspect of the invention relates to a method of making thinner a layer of a polymer film disposed on a semiconductor wafer, which includes the steps of: (a) providing a layer of polymer film on the semiconductor wafer, in which the layer has a first thickness; (b) exposing at least a portion of the polymer film to a partial-depth producing pattern on at least a portion of a photomask; and (b) developing the polymer film such that the at least a portion of the polymer film exposed to the partial-depth producing pattern has a second thickness, and in which the second thickness is smaller than the first thickness.

Yet a further aspect of the invention relates to a method of using a photomask to form a feature in a layer of a negative-acting photo-imageable polymer film, in which the feature has a smaller dimension greater than a critical dimension of photolithography tools used, and in which the feature penetrates only partially through the layer. The polymer film has a minimum structurally sound material width. The method includes the steps of: (a) disposing on the photomask a plurality of areas of chrome, each area has a smaller dimension smaller than the critical dimension and spaced is apart a distance smaller than the critical dimension; (b) exposing the polymer film to UV light shining through the photomask such that the UV light is blocked by the areas of chrome; and (c) developing the polymer film such that portions of the polymer film not exposed to the UV light and portions of the polymer film exposed to the UV light that have a width narrower than the minimum structurally sound material width, are removed.

Other aspects, features and advantages of the present invention will become apparent to those skilled in the art from the following detailed description and the accompanying drawings. It should be understood however that the detailed description and specific examples, while indicating preferred embodiments of the present invention, are given by way of illustration only and various modifications may naturally be performed without deviating from the present invention.

BRIEF DESCRIPTION OF THE DRAWINGS

The present invention will be described with greater specificity and clarity with reference to the following drawings, in which:

FIG. 23 is a simplified cross-sectional view of a small portion of the photomask with a partial-depth producing chrome pattern, and a cross-sectional view of a small portion of the wafer after exposure; and FIG. 24 is the portion of the wafer of FIG. 23 after developing.

Figure 1:
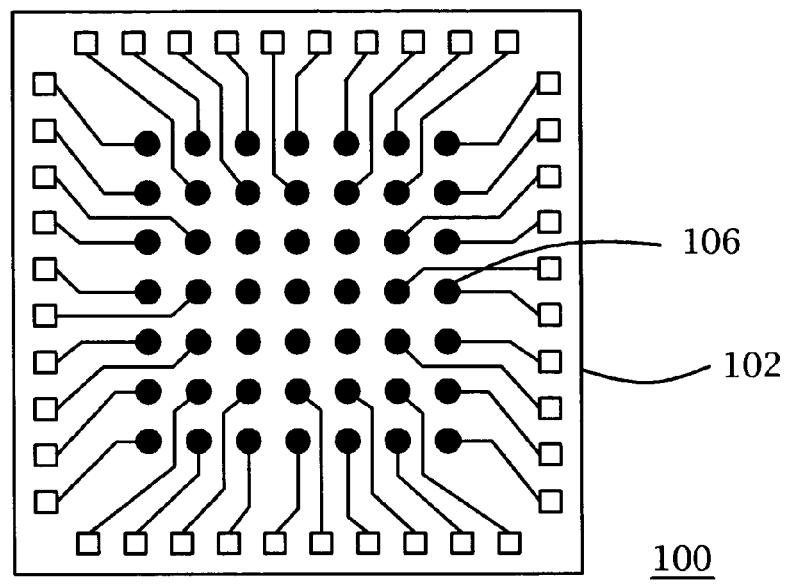
FIG. 1 is a top view of a simplified prior art wafer-level CSP.

For simplicity and clarity of illustration, the drawing figures illustrate the general manner of construction, and descriptions and details of well-known features and techniques are omitted to avoid unnecessarily obscuring the invention. Additionally, elements in the drawing figures are not necessarily drawn to scale.

DESCRIPTION OF THE PREFERRED EMBODIMENT

It should be understood that the embodiments discussed below are only examples of the many advantageous uses of the innovative teachings herein. In general, statements made in the specification of the present application do not necessarily limit any of the various claimed inventions. Some statements may apply to some inventive features but not to others. In general, unless otherwise indicated, singular elements may be in the plural and vice versa with no loss of generality, for example, "one die", "two die". The terms first, second, third, and the like, in the description and in the claims, if any, are used for distinguishing between similar elements and not necessarily for describing a sequential or chronological order. The terms top, front, side, and the like, in the description and in the claims, if any, are used for descriptive purposes and not necessarily for describing relative positions. All measurements are approximate, for example, "30 microns" means "30 microns, more or less".

FIG. 1 is a top view of a simplified prior art wafer-level CSP 100 comprising a prior art integrated circuit, or die, 102 and a plurality of solder ball pads 106.

Figure 2:
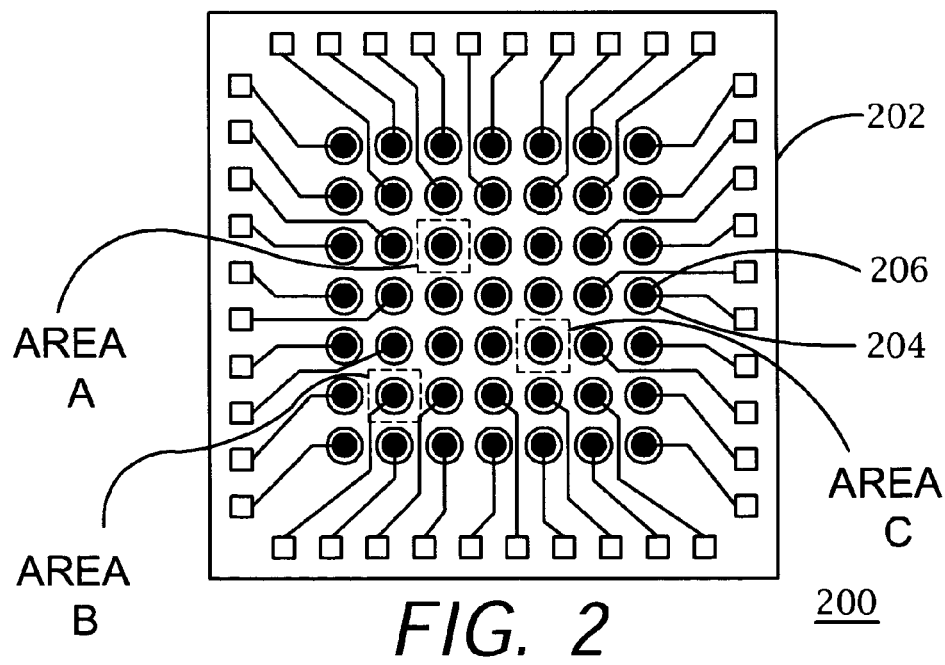
FIG. 2 is a top view of a simplified wafer-level CSP constructed in accordance with the preferred embodiments of the invention, showing a moat around each solder ball pad.

FIG. 2 is a top view of a simplified wafer-level CSP 200 constructed in accordance with the preferred embodiments of the invention, comprising a single integrated circuit, or die, 202 with a moat 204 around each solder ball pad 206. The die 202 is one of a plurality of die from a larger semiconductor wafer or "wafer" (not shown). Typically, there are 200–700 die per wafer. A wafer-level CSP design is described in U.S. Pat. No. 6,287,893 entitled METHOD FOR FORMING CHIP SCALE PACKAGE, issued Sep. 11, 2001, to Elenius et al., assigned to the assignee of the present invention, which is hereby fully incorporated herein by reference. The moat 204 is a ring-shaped (when seen in a top view) via formed in the surface of a passivation layer disposed on the wafer during a wafer-level processing step. By "wafer-level processing" it is meant, for example, that the moats 204 are formed in each die 202 prior to the die being cut from the wafer. Preferably, the passivation layer is a photo-imageable polymer film. The photo-imageable polymer film is typically benzocyclobutene (BCB), although the invention is useful with photo-imageable films of other materials. The moat 204 is used to confine and contain some material of the polymer collar that temporarily becomes much less viscous, or "liquefies", when the wafer is heated to the reflow temperature of solder ball metal during a subsequent wafer-level CSP 200 processing step.

Figure 3:
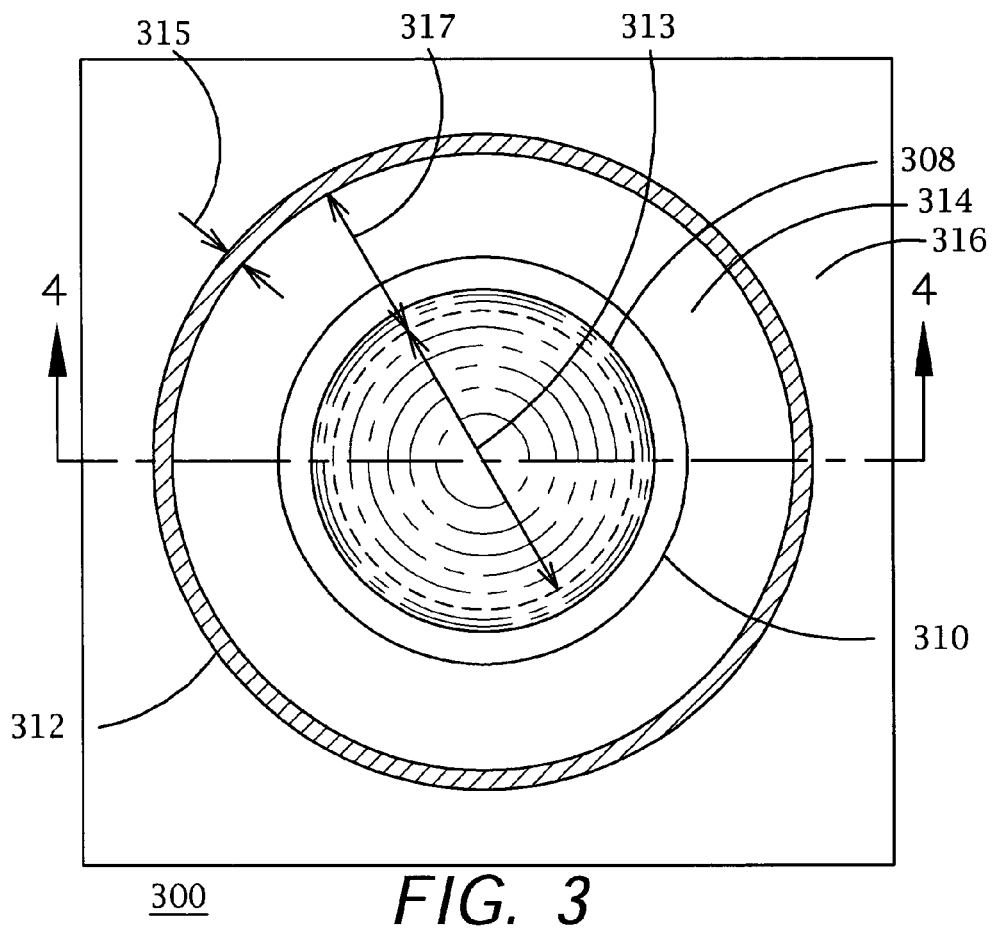
FIG. 3 is an enlarged simplified top view of area A of a wafer used to form the wafer-level CSP shown in FIG. 2, showing a solder ball with a polymer collar, surrounded by a full-depth moat, prior to heating of the wafer.

FIG. 3 is an enlarged simplified top view of portion 300, indicated by area A of FIG. 2, of a wafer used to form the wafer-level CSP 200, showing a solder ball 308 with a polymer collar 310 at a central feature 414 (see FIG. 4), surrounded by a full-depth moat 312, prior to heating of the wafer. Preferably, the polymer collar material is XNF-1502 manufactured by Ablestik Laboratories, of Rancho Dominguez, Calif. Alternatively, another material is used for the polymer collar 310. The use of a polymer collar around a solder ball is described in U.S. Pat. No. 6,578,755 entitled POLYMER COLLAR FOR SOLDER BUMPS, issued Jun. 17, 2003, to Elenius et al., assigned to the assignee of the present invention, which is hereby fully incorporated herein by reference. The central feature 414 has a diameter 313 of two hundred eighty (280) microns. The full-depth moat 312 defines a region 314 within the moat, and a region 316 without, or outside of, the moat. The full-depth moat 312 has a width 315 of thirty (30) microns. A distance 317 between the inside edge of full-depth moat 312 and the outside edge of the central feature 414 is seventy-five (75) microns. The solder ball 308 has a diameter 416 (see FIG. 4) of 300–350 microns.

Figure 4:
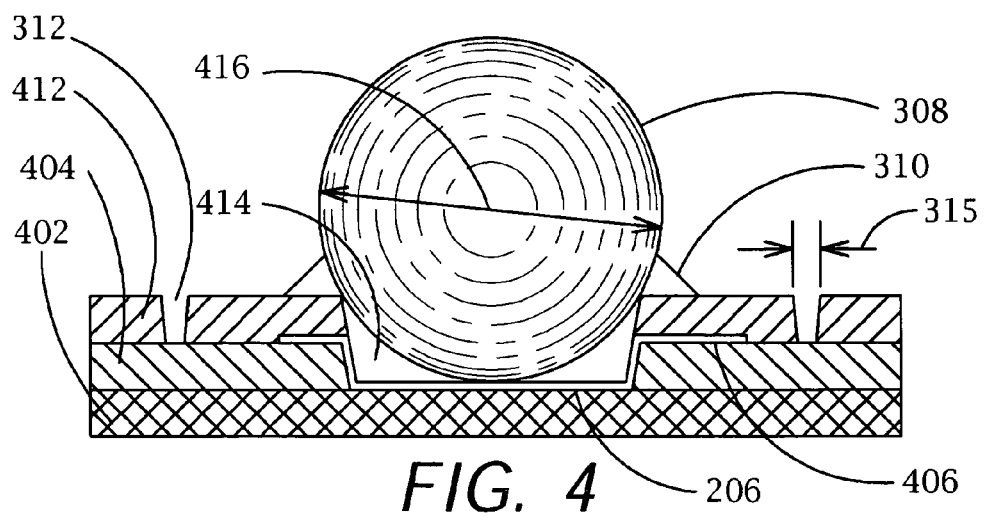
FIG. 4 is a cross-sectional view of FIG. 3 through cut-line 4—4.

FIG. 4 is a cross-sectional view of FIG. 3 through cut-line 4—4. The wafer typically comprises at least one layer of silicon, although the invention is also useful with wafers comprising other semiconductor materials. The one silicon layer 402 represents the wafer semiconductor substrate and all its layers, ready for CSP manufacturing. For simplification, the details of the wafer are not shown. The silicon layer 402 typically is coated with silicon nitride or silicon dioxide, dielectrics that generally do not conduct electricity, as a thin passivation layer (not shown), with openings over selected aluminum bond pads (not shown) of the integrated circuits of the wafer. The silicon nitride or silicon dioxide thin passivation layer is typically not placed on the wafer during CSP manufacturing, but is part of the wafer as it exists prior to CSP manufacturing. All other layers illustrated in FIG. 4 are typically placed on the wafer in the course of manufacturing the wafer-level CSP from the wafer.

A first polymer layer 404 of photo-imageable polymer film is disposed over the thin passivation layer. The first polymer layer 404 is typically 4–5 microns thick. A metalization layer is disposed on the first polymer layer 404, and over any exposed aluminum bond pads. The metalization layer includes an under bump metalization (UBM) area, or solder ball pad, 206 and a re-distribution layer (RDL) 406. The RDL comprises metal traces that form a conductive path between each solder ball pad 206 and any associated aluminum bond pad not positioned at the same x-y coordinates as the solder ball pad. A second polymer layer 412 of photo-imageable polymer film is disposed on the first polymer layer 404 and the metalization layer. The second polymer layer 412 is typically 4–5 microns thick. The first polymer layer 404 and the second polymer layer 412 are typically of the same material, preferably a CYCLO-TENE™ 4022-35 BCB passivation polymer, manufactured by Dow Chemical Company of Midland, Mich., as in a standard, two-layer ULTRA CSP® package. Alternatively, another one material is used for both photo-imageable polymer layers. As a further alternative, different materials are used for each photo-imageable polymer layer. The full-depth moat 312 is also used on wafer-level CSPs 200 with a single polymer layer of 4–5 microns in thickness. Typically, when a single polymer layer is used, no RDL is necessary.

The central feature 414 is a via that penetrates completely through both the first polymer layer 404 and the second polymer layer 412 of a finished wafer-level CSP. Using photo-imaging means well known to those skilled in the art, the central feature 414 is formed (i.e., opened) in the first polymer layer 404 prior to deposition of the second polymer layer 412, thereby exposing any associated aluminum bond pad positioned at the same x-y coordinates as the solder ball pad 206. The silicon nitride or silicon dioxide thin passivation layer is exposed at the bottom of the central feature 414 in designs wherein the associated aluminum bond pad is not positioned at the same x-y coordinates as the solder ball pad 206. The first polymer layer 404 is then cured by baking in an oven at a temperature and for a period required for the polymer to polymerize. The metalization layer, which typically comprises layers of aluminum, nickel vanadium and copper, is sputtered over selected portions of the first polymer layer 404, over any exposed aluminum bond pads, and over the silicon nitride or silicon dioxide at the bottom of the central feature 414. Next, the second polymer layer 412 is disposed on the first polymer layer 404 including on the portions of the first polymer layer having metalization. Using photo-imaging means well known to those skilled in the art, full-depth moat 312 is formed in the wafer completely through the second polymer layer 412, and, at the same time, the central feature 414 is re-opened down to the metalization layer, or solder ball pad 206. The first polymer layer 404 is exposed at the bottom of full-depth moat 312. The full-depth moat 312 does not overlie the RDL 406, as shown in FIG. 4. Preferably, full-depth moat 312 is used in cases where the moat does not overlie the RDL 406.

Figure 5:
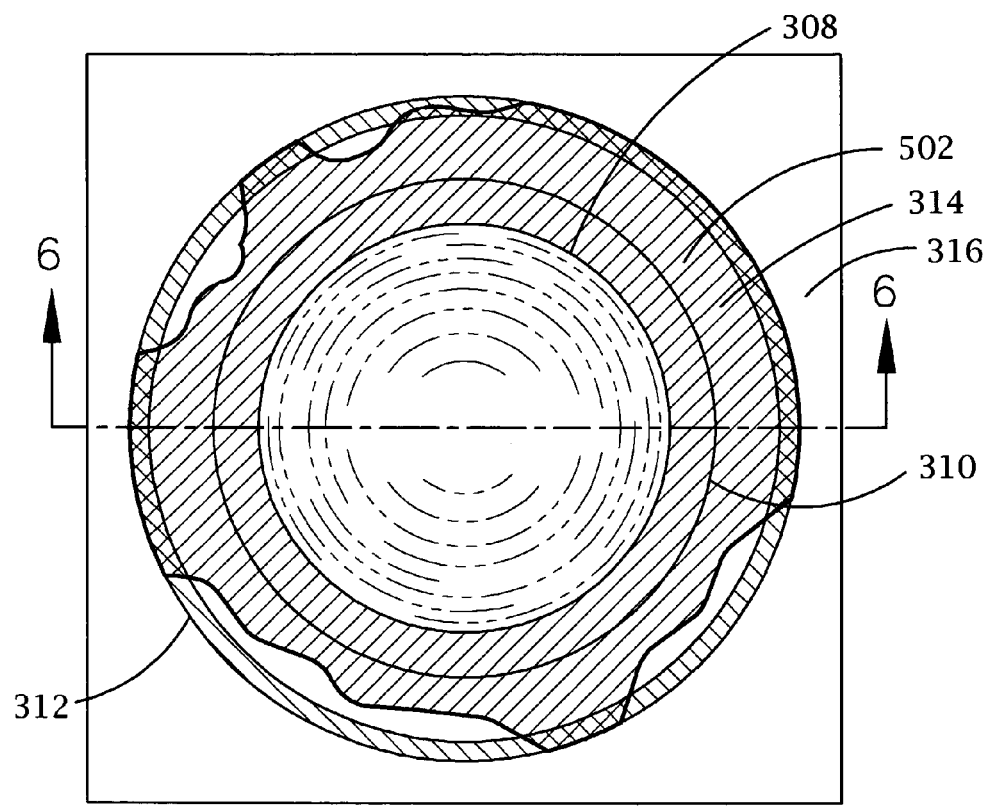
FIG. 5 is an enlarged simplified top view of area A of the wafer used to form the wafer-level CSP shown in FIG. 2, showing the solder ball with the polymer collar, surrounded by the full-depth moat, subsequent to heating of the wafer.

FIG. 5 is an enlarged simplified top view of the portion 300, showing the solder ball 308 with the polymer collar 310, surrounded by full-depth moat 312, subsequent to heating of the wafer. As the solder ball 308 is reflowed, some liquefied material of the polymer collar 310 spreads out, but advantageously, only into region 314 within full-depth moat 312. The full-depth moat 312 confines and contains the liquefied polymer collar material, and advantageously prevents it from spreading beyond the moat into region 316 outside the moat. During later stages of the reflow process, the liquefied polymer collar material that flowed into region 314 becomes much more viscous and hardens or "solidifies", and forms a residual 502. FIG. 5 shows that most of the region 314 within full-depth moat 312 contains residual 502 of polymer collar material. The residual 502 is semi-transparent. The residual 502 does not necessarily completely fill the region 314 within full-depth moat 312 (though it may), nor does it necessarily spread out equally in all directions from the main portion of the polymer collar 310 (though it may). Therefore, there might be some random-looking appearance of the residual material as FIG. 5, however, the residual 502 is contained/controlled by full-depth moat 312 and the spread of the residual therefore is limited by the moat. In some instances the residual 502 may completely cover the bottom surface of full-depth moat 312.

Figure 6:
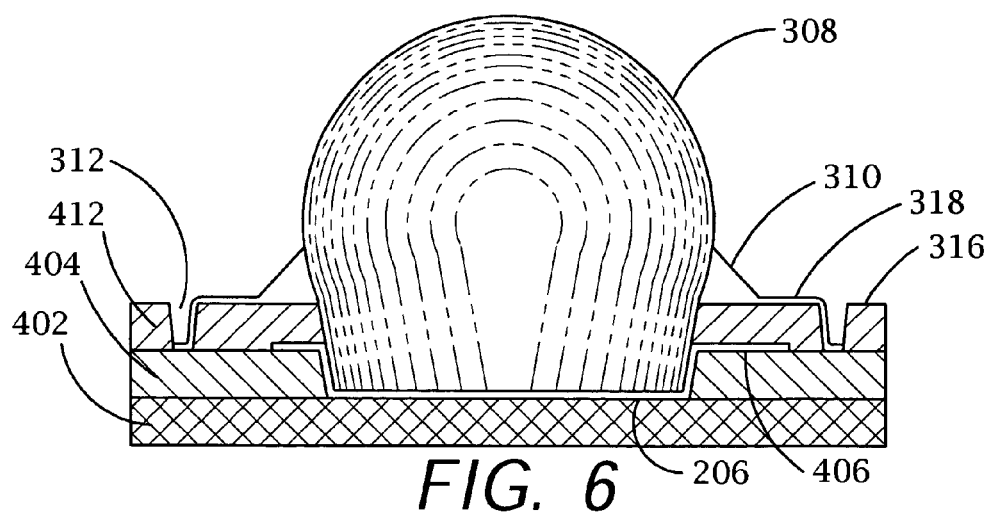
FIG. 6 is a cross-sectional view of FIG. 5 through cut-line 6—6.

FIG. 6 is a cross-sectional view of FIG. 5 through cut-line 6—6. The full-depth moat 312 retains residual 502 of polymer collar material that spreads out along the surface of the second polymer layer 412 away from the polymer collar 310. The flow of the residual 502 occurs prior to, and during solder reflow. Without the presence of full-depth moat 312, the residual 502 flows out in a random pattern and for a greater distance, and, as a result, is cosmetically unacceptable. The purpose of full-depth moat 312 is to contain the flow of the residual and prevent/minimize its flow beyond the moat, thereby enhancing the cosmetic appearance of the wafer-level CSP. As a result of the presence of full-depth moat 312, residual 502 flows a shorter distance from the polymer collar, the extent of residual flow is more nearly uniform in all directions, and the outer edge of the flow is thereby more nearly circular. The full-depth moat 312 surrounds the central feature 414; alternatively, the full-depth moat is a stand-alone feature.

Figure 7:
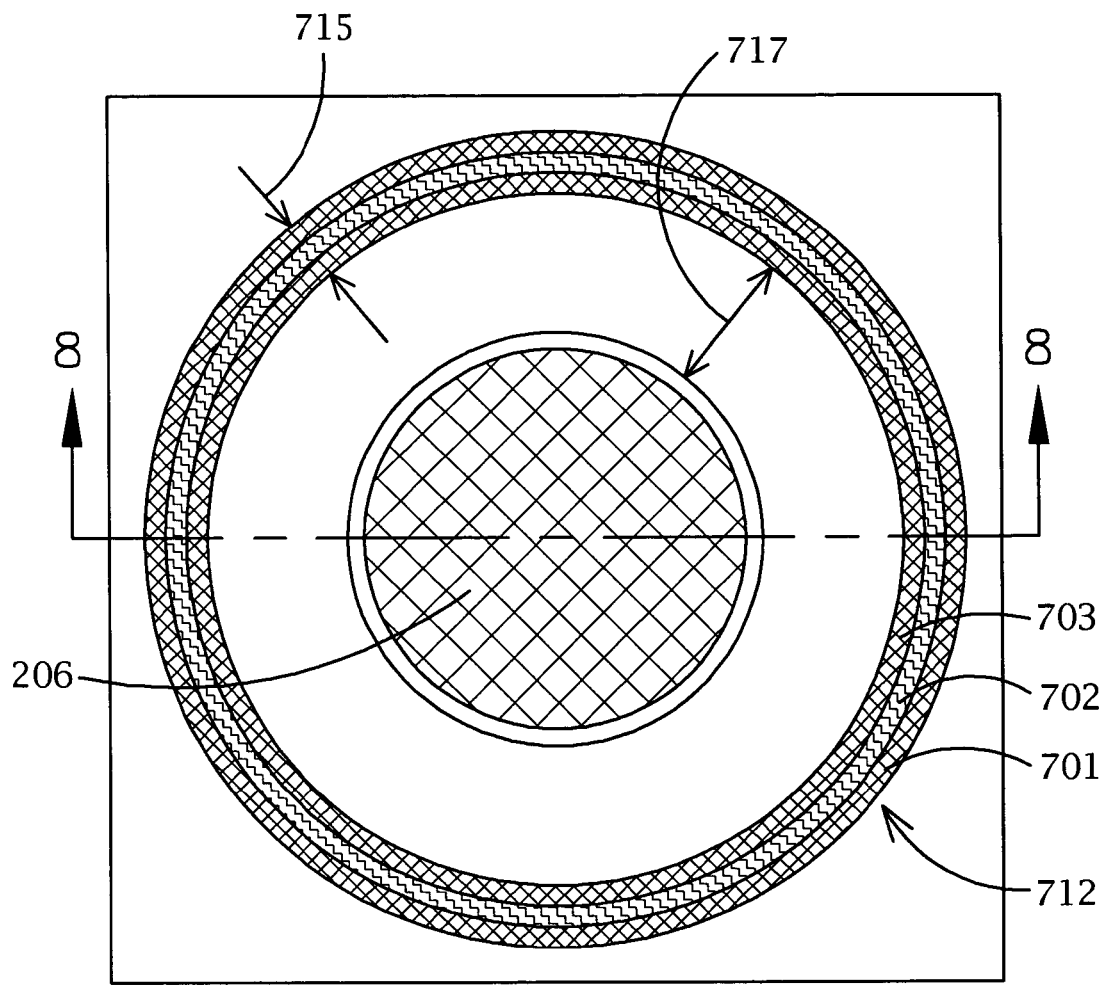
FIG. 7 is a simplified top view of area B of the wafer used to form the wafer-level CSP shown in FIG. 2, showing a first embodiment of a partial-depth moat, formed by a plurality of lines.

FIG. 7 is a simplified top view of the portion 300, indicated by area B of FIG. 2, of the wafer used to form the wafer-level CSP 200, showing a first embodiment of a partial-depth moat 712 formed by a plurality of lines 701, 702 and 703 around the central feature 414, preferably using the photo-imaging means in accordance with the invention. The partial-depth moat 712 has a width 715 of twenty-three (23) microns. A distance 717 between the inside edge of partial-depth moat 712 and the outside edge of the central feature 414 is seventy-five (75) microns. It should be noted that the invention is not limited to using three (3) lines. Any number of lines greater than one (1) can be used.

Figure 8:
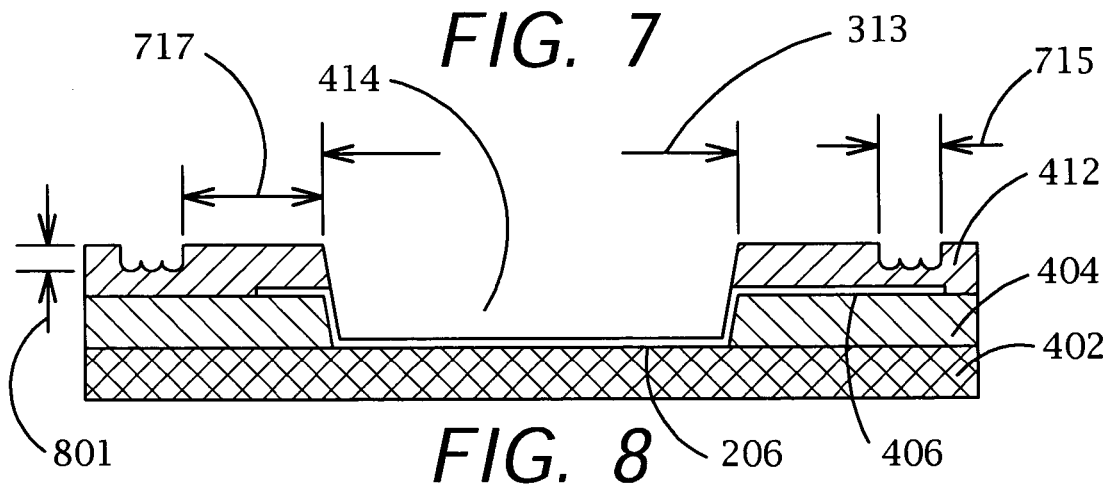
FIG. 8 is a cross-sectional view of FIG. 7 through cut-line 8—8.

FIG. 8 is a cross-sectional view of FIG. 7 through cut-line 8—8. Using means well known to those skilled in the art, the central feature 414 is formed completely through both the second polymer layer 412 and the first polymer layer 404. The solder ball pad 206 is exposed at the bottom of the central feature 414. The partial-depth moat 712 is formed in the wafer partially through the second polymer layer 412. The second polymer layer 412 is exposed at the bottom of partial-depth moat 712. The partial-depth moat 712 does not penetrate to the first polymer layer 404. The partial-depth moat 712 has a moat depth 801 of 1–99% of the thickness of the second polymer layer 412. Alternatively, the partial-depth moat 712 is used on wafer-level CSPs 200 having a single polymer layer of 4–5 microns in thickness. In such case, partial-depth moat 712 has a moat depth 801 of 1–99% of the thickness of the single polymer layer. In FIG. 8, the partial-depth moat 712 overlies the RDL 406. The RDL 406 is not exposed through partial-depth moat 712. Advantageously, the partial-depth moat 712 may cross underlying metal traces without exposing the RDL 406.

Figure 9:
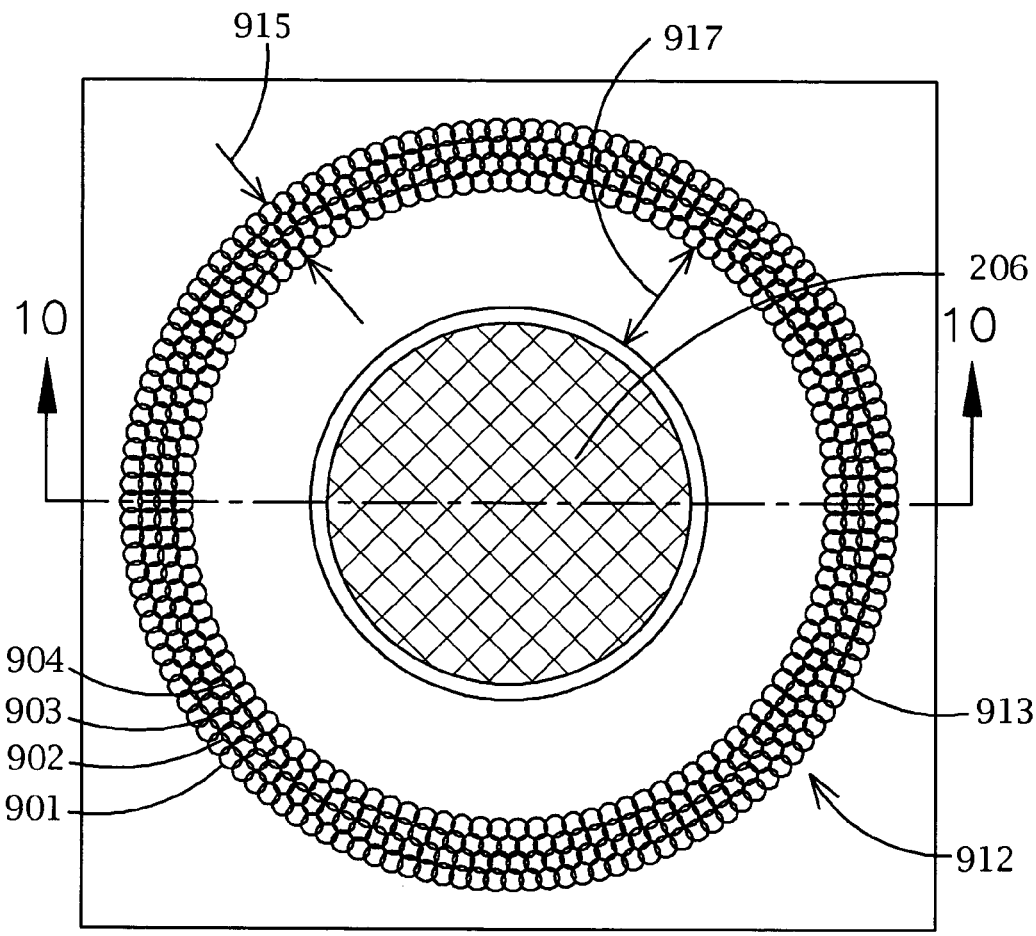
FIG. 9 is a simplified top view of area C of the wafer used to form the wafer-level CSP shown in FIG. 2, showing a second embodiment of the partial-depth moat, formed by a multiplicity of circles.

FIG. 9 is a simplified top view of the portion 300, indicated by area C of FIG. 2, of the wafer used to form the wafer-level CSP 200, showing a second embodiment of the partial-depth moat. Partial-depth moat 912 is formed by a multiplicity of circles 913 around the central feature 414, preferably using photo-imaging means in accordance with the invention. The multiplicity of circles 913 are in the form of four (4) concentric rows 901–904 of closely-packed circles. The partial-depth moat 912 has a width 915 of twenty-eight (28) microns. A distance 917 between the inside edge of partial-depth moat 912 and the outside edge of the central feature 414 is seventy-five (75) microns. It should be noted that the invention is not limited to using four (4) concentric rows of circles. Any number of rows can be used, provided that a plurality of circles is used. Partial-depth moats 712 and 912 surround the central feature 414; alternatively, the partial-depth moats are stand-alone features.

Figure 10:
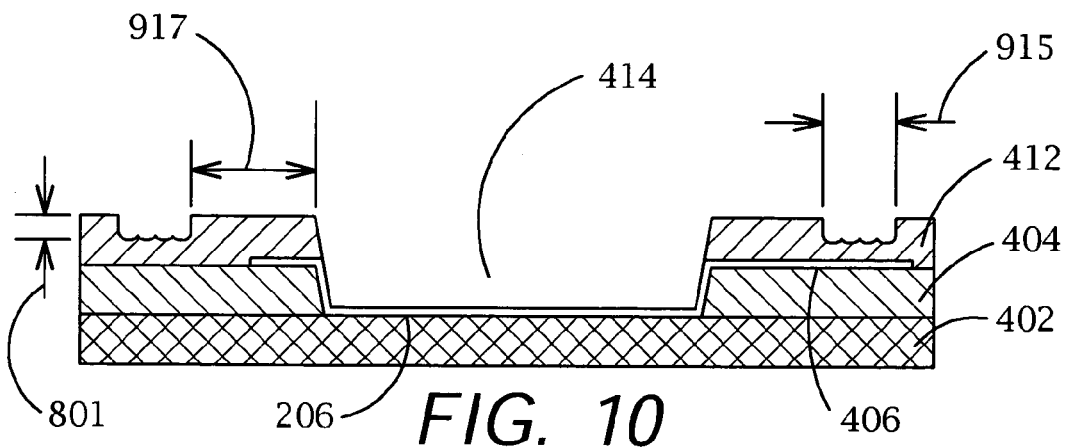
FIG. 10 is a cross-sectional view of FIG. 9 through cut-line 10—10.

FIG. 10 is a cross-sectional view of FIG. 9 through cut-line 10—10. Using means well known to those skilled in the art, the central feature 414 is formed in the wafer completely through both the second polymer layer 412 and the first polymer layer 404. The solder ball pad 206 is exposed at the bottom of the central feature 414. The partial-depth moat 912 is formed in the wafer partially through the second polymer layer 412. The partial-depth moat 912 does not penetrate to the first polymer layer 404, therefore, the second polymer layer 412 is exposed at the bottom of partial-depth moat 912. The moat depth 801 of partial-depth moat 912 is 1–99% of the thickness of the second polymer layer 412. Alternatively, the partial-depth moat 912 is used on wafer-level CSPs 200 having a single polymer layer of 4–5 microns in thickness. In such case, partial-depth moat 912 has a moat depth 801 of 1–99% of the thickness of the single polymer layer. The partial-depth moat 912 overlies the RDL 406. As shown in FIG. 10, the RDL 406 is not exposed through partial-depth moat 912. Advantageously, partial-depth moat 912 may cross underlying metal traces without exposing the RDL 406.

Figure 11:
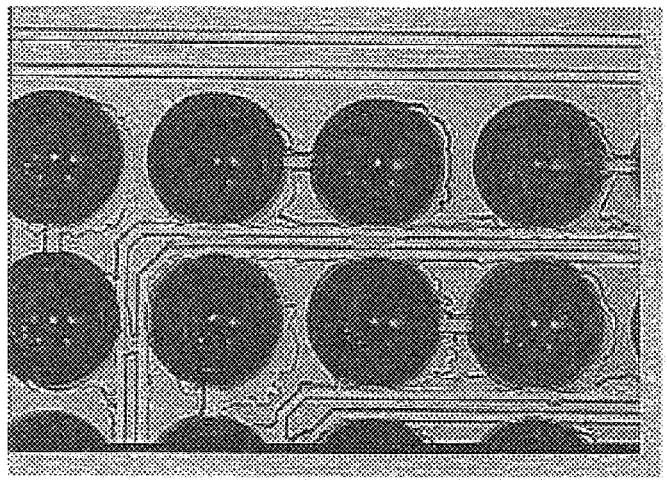
FIG. 11 is a photomicrograph of a portion of a prior art wafer showing the solder ball and the polymer collar following heating of the wafer.

FIG. 11 is a photomicrograph of a portion of a prior art wafer showing the solder ball 308 and the polymer collar 310 following heating of the wafer. The residue 502 of polymer collar material extends an irregular distance from the solder ball 308. After the central features 414 are formed in the wafer, a polymer collar 310, which is a fluxing polymer material, is applied to the central feature 414, and then solder balls 308 are placed onto the fluxing polymer spots. The wafer is subsequently processed through reflow and cure processes where the polymer collar 310 softens and has a tendency to flow, and then cure. As can be seen in FIG. 11, without the moats 204, the final appearance of the residue 502 is random and uncontrolled.

Figure 12:
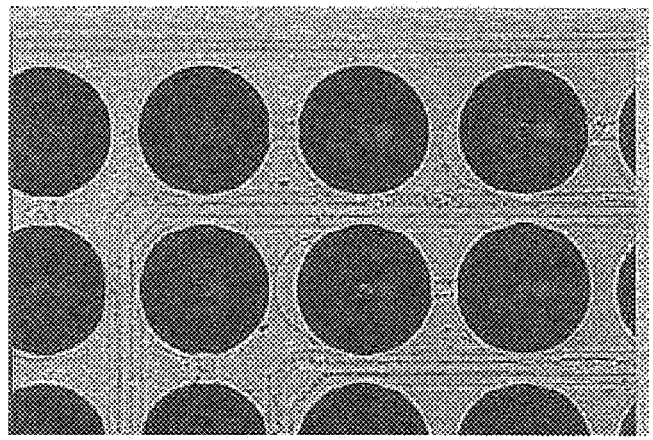
FIG. 12 is a photomicrograph of a portion of a wafer in accordance with the invention showing the solder ball and the polymer collar following heating of the wafer.

FIG. 12 is a photomicrograph of a portion of a wafer in accordance with the invention, showing the solder ball 308 and the polymer collar 310 following heating of the wafer. FIG. 12 illustrates the results of the same processing steps and materials used on the prior art wafer in FIG. 11, but with moats 204. FIG. 12 shows that the moat 204 confines and contains the residual 502 within the moat confines. The moat 204 assists in creating a concentric/uniformly shaped, cured fluxing polymer, and the moat inhibits random flow of the residual 502 from the polymer collar 310.

Figure 13:
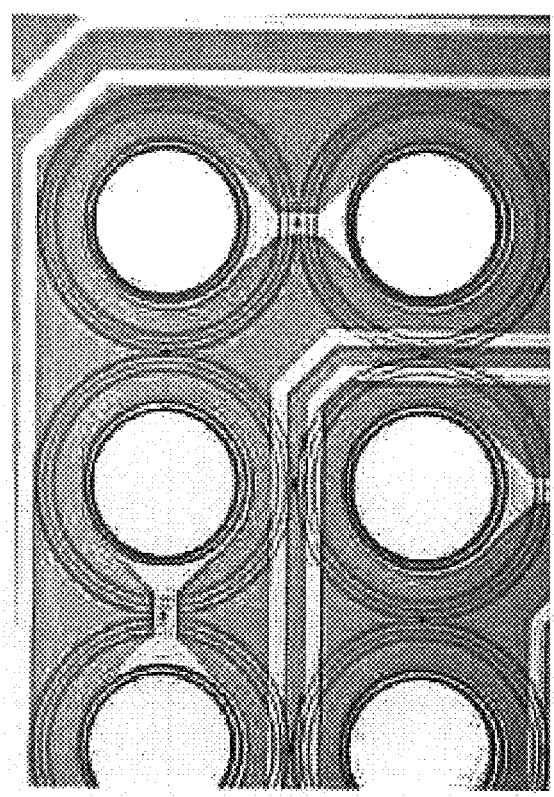
FIG. 13 is a photomicrograph of a portion of a wafer in accordance with the invention, showing the partial-depth moat formed by a plurality of lines around each solder ball pad.

FIG. 13 is a photomicrograph of a portion of a wafer in accordance with the invention, showing partial-depth moat 712 formed by the plurality of lines 701, 702 and 703 around each solder ball pad 206. There is no solder ball or polymer collar on the wafer shown in FIG. 13.

Figure 14:
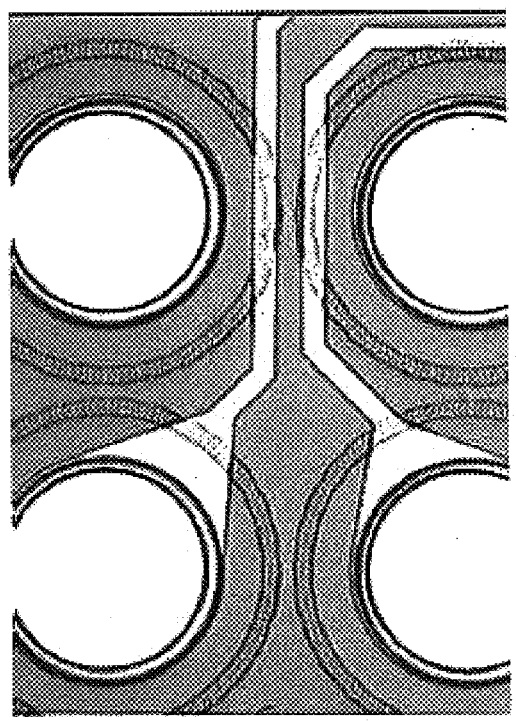
FIG. 14 is a photomicrograph of a portion of a wafer in accordance with the invention, showing the partial-depth moat formed by a multiplicity of circles around each solder ball pad.
Figure 15:
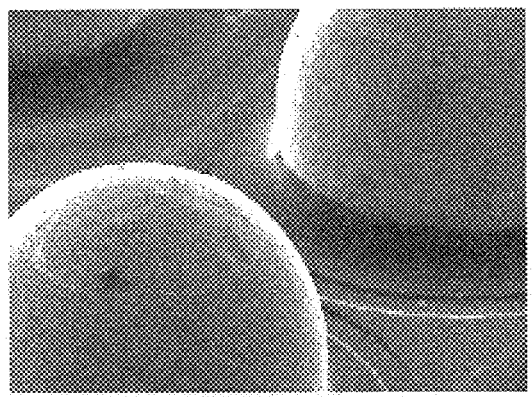
FIG. 15 is a photomicrograph of a portion of a wafer in accordance with the invention, with the partial-depth moat formed by a plurality of lines around each solder ball pad, showing the solder ball and the polymer support collar following heating of the wafer.
Figure 16:
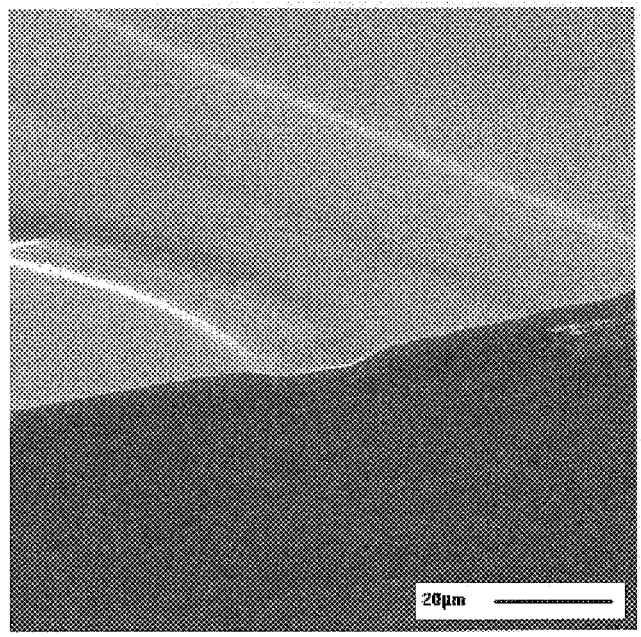
FIG. 16 is a photomicrograph of a cross-section of the partial-depth moat shown in FIG. 17.
Figure 17:
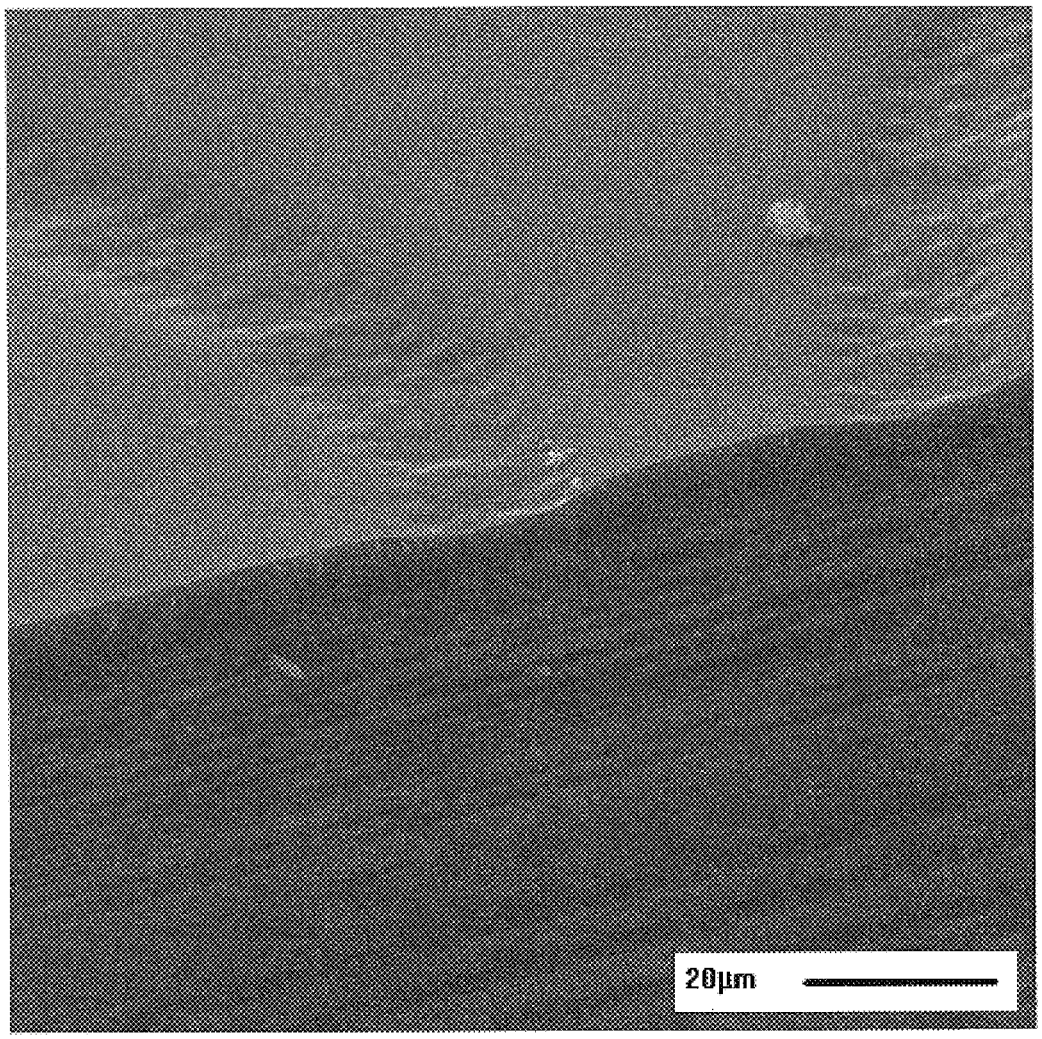
FIG. 17 is a photomicrograph of a cross-section of a wafer in accordance with the invention, with the partial-depth moat formed by a multiplicity of circles.

FIG. 14 is a photomicrograph of a portion of a wafer in accordance with the invention, showing partial-depth moat 912 formed by a multiplicity of circles 913 around each solder ball pad 206. There is no solder ball or polymer collar on the wafer shown in FIG. 14. FIGS. 15–17 are photographs made with a scanning electron microscope. FIG. 15 is a photomicrograph of a portion of a wafer in accordance with the invention, with partial-depth moat 712 formed by the plurality of lines 701, 702 and 703 around the central feature 414, showing the solder ball 308 and the polymer collar 310 following heating of the wafer.

FIG. 16 is a photomicrograph of an enlarged cross-section of partial-depth moat 712 shown in FIG. 15. The partial-depth moat 712 shown in FIGS. 15 and 16 is produced by a photomask having three (3) concentric seven (7) micron wide chrome lines 701, 702 and 703 separated by one (1) micron wide spaces, using the method in accordance with the invention. Although produced by three lines, a single, partial-depth moat is formed, as shown in FIGS. 15 and 16. The partial-depth moat 712 of FIGS. 15 and 16 is twenty-three (23) microns wide and has a moat depth of 2.1 microns, which is about 60% through the second polymer layer 412.

FIG. 17 is a photomicrograph of a cross-section of a wafer in accordance with the invention, showing partial-depth moat 912 formed by a multiplicity of circles 913. The partial-depth moat 912 shown in FIG. 17 is produced by a photomask having four (4) rows of closely-packed seven (7) micron diameter chrome circles, using the method in accordance with the invention. Although produced by a multiplicity of circles, a single, partial-depth moat is formed, as shown in FIG. 17. The partial-depth moat 912 shown in FIG. 17 is twenty-eight (28) microns wide and has a moat depth of 2.2 microns, which is about 64% through the second polymer layer 412.

Figure 18:
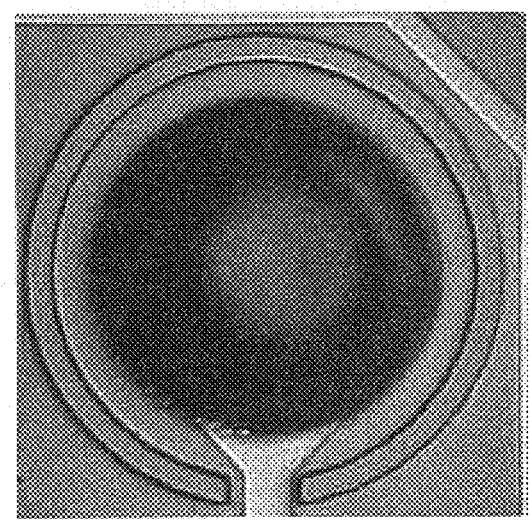
FIG. 18 is a photomicrograph of a portion of a wafer in accordance with the invention, showing the full-depth moat around the solder ball pad, and in which the full-depth moat is interrupted by a metal trace.

FIG. 18 is a photomicrograph of a portion of a wafer in accordance with the invention, showing full-depth moat 312 around the solder ball pad 206, and in which the full-depth moat is interrupted by a metal trace. One of the partial-depth moats 712 and 912 is preferably used where a moat overlies a metal trace. Alternatively, the full-depth moat 312 is used, and the full-depth moat is preferably interrupted at the metal trace, as shown in FIG. 18, so as not to expose the metal trace. As a further alternative (not shown), when exposing a particular metal trace is not deleterious, full-depth moat 312 crosses a metal trace, thereby exposing the RDL 406.

The invention advantageously keeps the applied material in a concentric shape/volume for either structural and/or cosmetic purposes. The ability of the moat 204, 312, 712 and 912 to confine the residual 502 depends upon the volume of the moat, the depth of the moat, and the distance 317, 717 and 917 from central feature 414. Advantageously, it is easier to perform automatic optical inspection of bumped wafers when the spread of the residual 502 is controlled by a moat.

Figure 19:
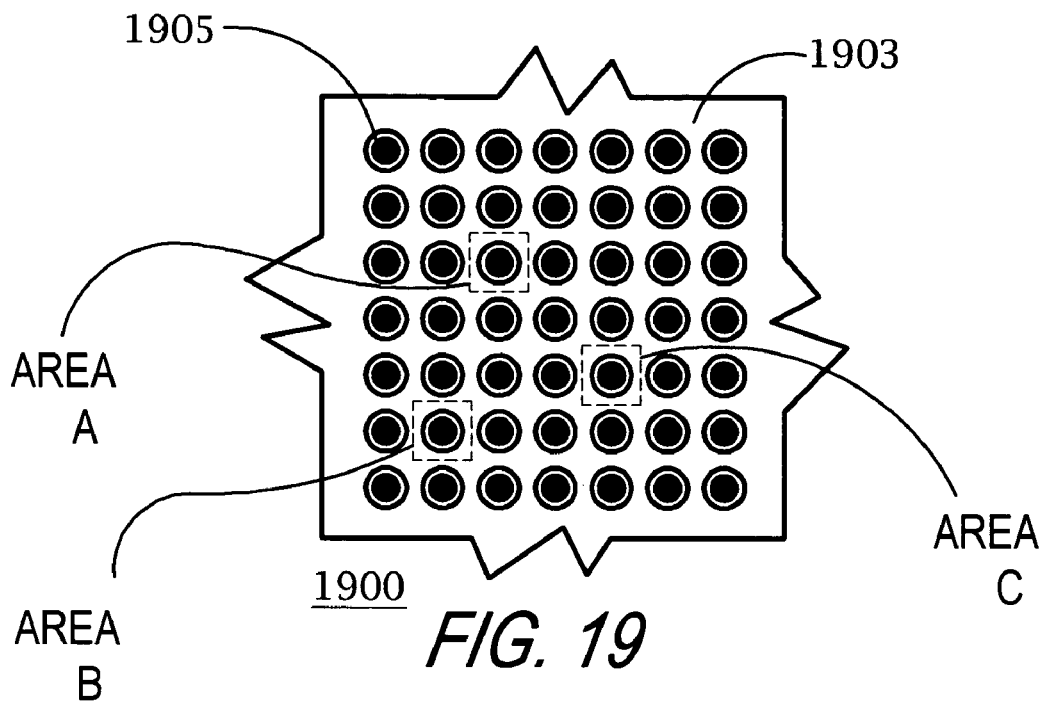
FIG. 19 is a simplified plan view of a portion of a photomask in accordance with the invention.

FIG. 19 is a plan view of a portion of a photomask 1900, corresponding to one die 202, used to make features in a layer of negative-acting polymer film. On the full photomask (not shown), there is a plurality of such portions that mimic the die layout of the entire wafer. For conciseness, the portion of the photomask 1900 is also referred to as the photomask 1900. The photomask 1900 comprises a transparent plate, preferably glass or quartz 1903, on which an ultraviolet (UV) light-blocking material, preferably chrome 1905, is disposed in preselected patterns. The photomask 1900 is used to expose, or cause a chemical change in, preselected portions of the polymer film, thereby rendering the polymer film photo-definable after developing. A prior art photomask has chrome disposed in patterns that have a substantially same shape and size of the features that are desired to be produced in the polymer film. In the case of a negative acting polymer film, the polymer film exposed to light becomes cross-linked and cannot be developed, i.e., removed, from the exposed area. In the case of a positive acting polymer film, the polymer film exposed to light is removed during developing.

The photomask 1900 is used to form features in a layer of negative-acting polymer film, such as the second polymer layer 412. In FIG. 19, dark areas are chrome 1903 and the light area is quartz 1905. The portion of the photomask 1900 is used to form forty-nine (49) central features 414 and a moat 204 around each central feature of one die 202. When the polymer film is imaged, it is generally desired that features, such as central feature 414 and full-depth moat 312, are achieved through the entire film thickness, or layer. The photomask 1900 in accordance with the invention is used to make full-depth features; however, the photomask also advantageously makes partial-depth features during a same series of photo-imaging steps.

All photo-imageable polymer film systems and processes, have some minimum size, or critical dimension, that is resolvable to open the structural feature, or feature, completely through the polymer layer. In the examples described in the preferred embodiment, the critical dimension for a linear structural feature, including a curved linear structural feature, is ten (10) microns and for a circular structural feature is thirty (30) microns. Assuming that the polymer layer is in an x-y plane of an x-y-z coordinate system, a depth of the feature is in the z direction. When it is desired that the feature penetrate completely through the polymer layer, the feature size, i.e., the smaller of the dimensions in the x-y plane, of the feature must be larger than the critical dimension. A feature having the feature size smaller than the critical dimension does not penetrate completely through the polymer layer.

The critical dimension is determined by many factors including the type of material comprising the polymer layer, the thickness of the polymer layer, the exposure tool used, several exposure process parameters such as exposure energy, exposure time and depth of focus, and several developing process parameters such as the developing solution, temperature and time. The method in accordance with the invention utilizes conventional expose/develop technology to create structured features in polymer films. The method in accordance with the invention takes advantage of the limitations of conventional exposure/developing tools, which cannot make full-depth features in polymer films smaller than the critical dimension.

Preferably, the structured feature is in the shape of a moat 204, a full-depth moat 312 that penetrates fully through the polymer film of the second polymer layer 412, or a partial-depth moat 712 and 912 that penetrates to a partial-depth into the polymer film of the second polymer layer. The method in accordance with the invention advantageously allows for the creation of a partial-depth feature utilizing the same process/steps/sequences performed at the same time that a full-depth feature is formed through the entire film thickness.

The chrome pattern on the photomask 1900 comprises more than one chrome area, each area having two dimensions in the x-y plane of the photomask. The lesser of the two dimensions is the smaller dimension. When it is desired that the feature penetrates only partially through the polymer layer, the photomask in accordance with the invention utilizes a plurality of chrome areas, each chrome area having a smaller dimension less than the critical dimension, and conventional exposure/developing tools and methods are used in a same manner as if a full-depth feature were to be formed. When it is desired that the feature penetrates completely through the polymer layer, the smaller dimension of the chrome area must be larger than the critical dimension.

Preferably, the photomask 1900 has a plurality of chrome patterns, each pattern having a different smaller dimension, on a single photomask. This allows for the creation of a developed polymer film not only with multiple types of partial-depth features but also with full-depth features, such as through vias. Advantageously, all the features are created in one series of photo-imaging steps. For example, photomask 1900 shows three (3) areas, indicated by area A, area B and area C, within a region of the photomask corresponding to a single die 202. Area A forms a full-depth feature, while area B and area C each form a partial-depth feature in a different way. For simplicity of illustration, area A, area B and area C are shown being within the region of the photomask corresponding to the single die 202; however, in general, they are on the photomask at locations corresponding to more than one die of the wafer.

Figure 20:
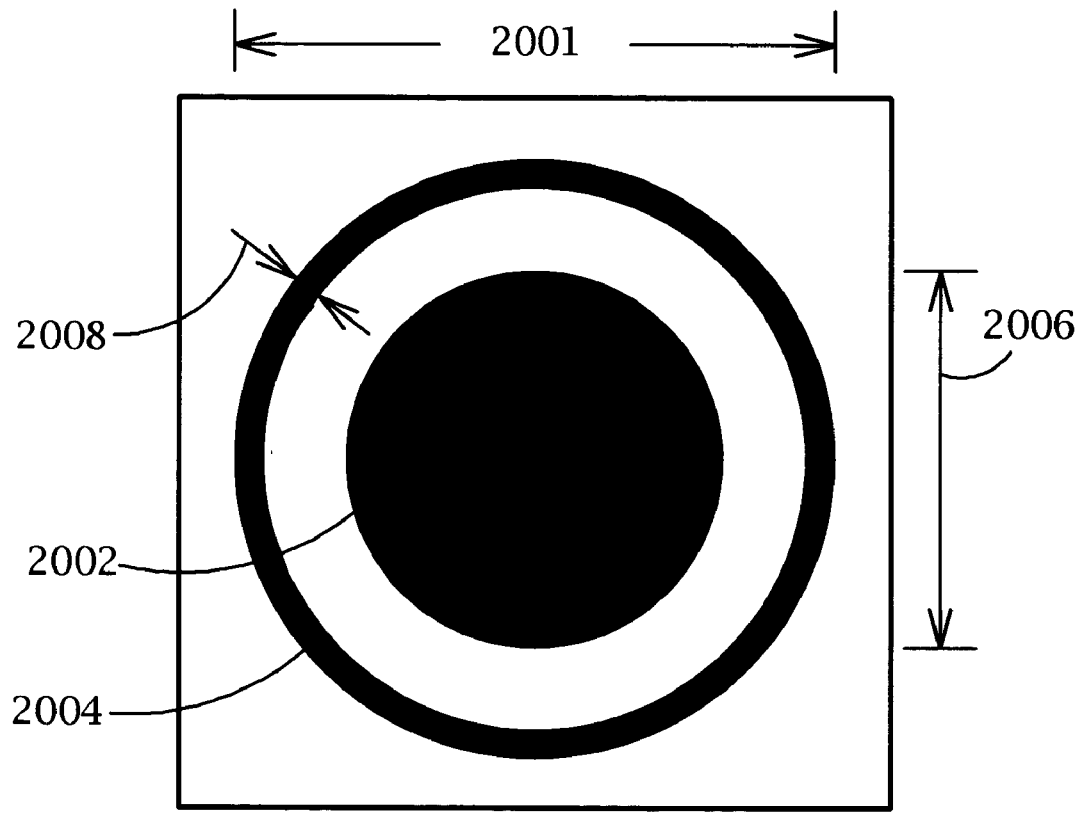
FIG. 20 is a plan view enlargement of area A of the photomask of FIG. 19 showing a full-depth producing chrome pattern.

FIG. 20 is an enlarged portion 2000 of the photomask 1900, indicated by area A of FIG. 19, showing a full-depth producing pattern of chrome. The dark areas are chrome and the light area is clear quartz. The full-depth producing pattern of chrome comprises a central chrome circle 2002 and a chrome ring 2004 around the central chrome circle, disposed on the photomask 1900. The central chrome circle 2002 has a diameter 2006 of two hundred eighty (280) microns, which is also the smaller dimension of the central chrome circle. The central chrome circle 2002 on the photomask 1900 produces the central feature 414 in the second polymer layer 412. The chrome ring 2006 has a width 2008 of thirty (30) microns and a diameter 2010 of three hundred seventy-five (375) microns. The smaller dimension of the chrome ring 2004 is thirty (30) microns. The chrome ring 2004 produces the full-depth moat 312 in the second polymer layer 412. The width 2008 of the chrome ring 2004 is greater than the minimum width-opening capability of the process, or critical dimension, therefore, the thirty (30) micron wide chrome ring forms a full-depth moat 312, having a width 315 of thirty (30) microns, in the second polymer layer 412. Therefore, area A of the photomask 1900 in accordance with the invention is used to form full-depth features.

Figure 21:
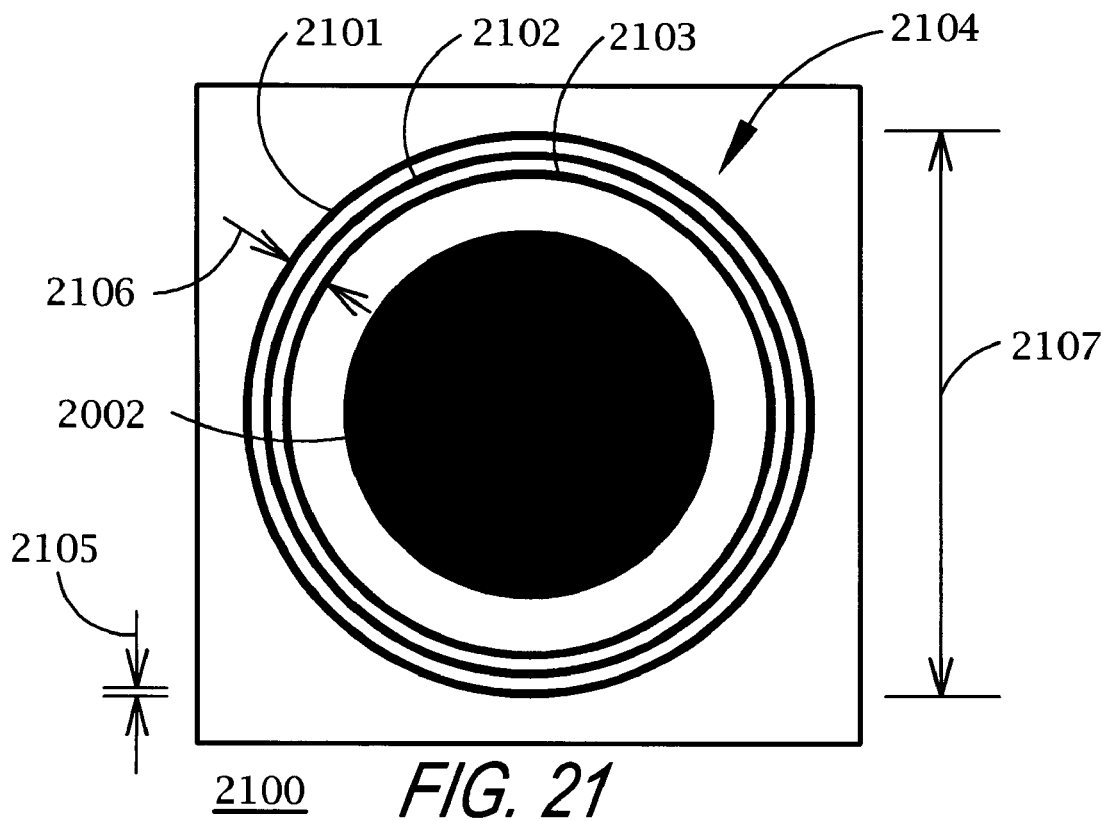
FIG. 21 is a plan view enlargement of area B of the photomask of FIG. 19 showing a partial-depth producing chrome pattern, in the form of three concentric lines of chrome.

FIG. 21 is an enlarged portion 2100 of the photomask 1900, indicated by area B of FIG. 19, showing the central chrome circle 2002, surrounded by a partial-depth producing chrome pattern 2104, disposed on the quartz of the photomask. The partial-depth producing chrome pattern 2104 comprises three concentric chrome lines 2101–2103, each chrome line having a width 2105 of seven (7) microns. The three concentric chrome lines 2101–2103 are one (1) micron apart. For clarity of illustration, the space between the three concentric chrome lines 2101–2103 is exaggerated. Therefore, the partial-depth producing chrome pattern 2104 on the photo mask has a width 2106 of twenty-three (23) microns. The diameter 2107 of the partial-depth producing chrome pattern 2104 is three hundred seventy-five (375) microns, which varies depending on the diameter of the solder ball 308 and the solder ball pitch. The smaller dimension (the width 2105) of the three concentric chrome lines 2101–2103 is seven (7) microns. The smaller dimension of each of the three concentric chrome lines 2101–2103 is less than the critical dimension. The three concentric chrome lines 2101–2103 on the photomask 1900 act together to form a single partial-depth moat 712, having a width 715 of twenty-three (23) microns, in the second polymer layer 412. Area B of the photomask 1900 is used to form one or more partial-depth features in accordance with the invention while also being used to form one or more full-depth features, at the same time.

Figure 22:
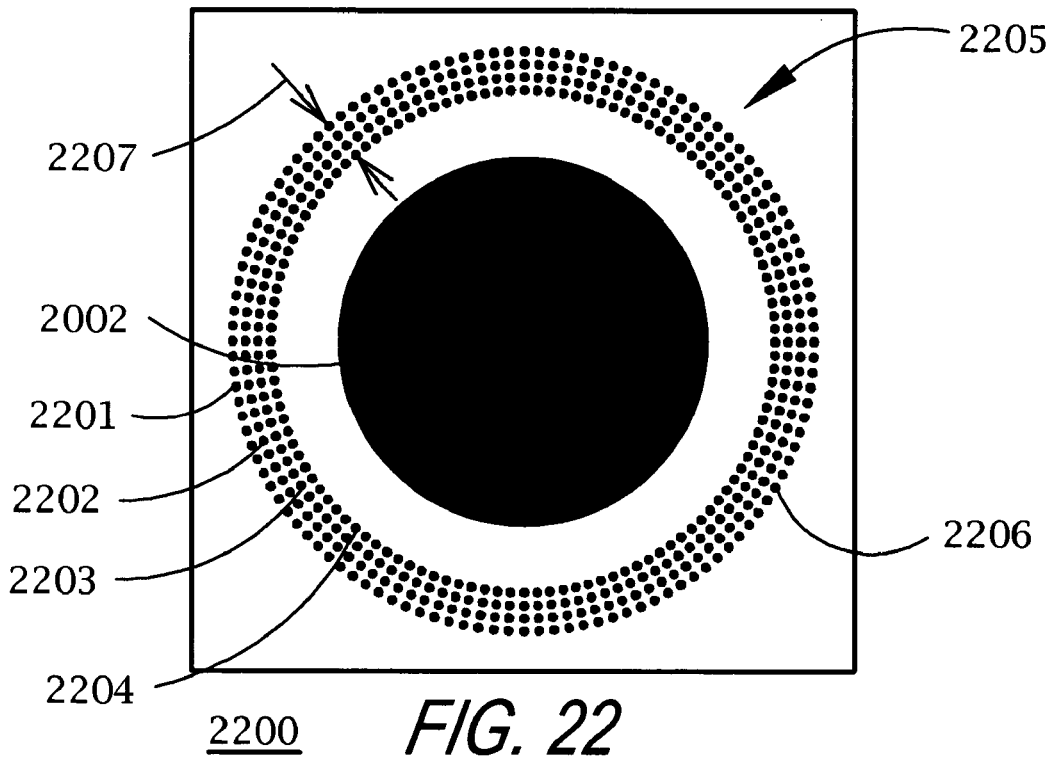
FIG. 22 is a plan view enlargement of area C of the photomask of FIG. 19 showing a partial-depth producing chrome pattern, in the form of four concentric rings of circles of chrome.

FIG. 22 is an enlarged portion 2200 of the photomask 1900, indicated by area C of FIG. 19, showing the central chrome circle 2002 and a partial-depth producing chrome pattern 2205 disposed on the quartz of the photomask. The central chrome circle 2002 on the photomask 1900 is surrounded by a plurality of the small chrome circles 2206 forming four (4) concentric rings 2201–2204 of the small chrome circles. The partial-depth producing chrome pattern 2205 comprises the four concentric rings 2201–2204 of the small chrome circles 2206. Each small chrome circle 2206 has a diameter of seven (7) microns. The partial-depth producing chrome pattern 2205 on the photomask 1900 has a width 2207 of twenty-eight (28) microns. The diameter of each of the small chrome circles 2206 on the photomask 1900 is less than the critical dimension. The plurality of small chrome circles 2206 on the photomask 1900 act together to form the single partial-depth moat 912 having a width 915 in the second polymer layer 412. Area C of the photomask 1900 is used to form one of more partial-depth features in accordance with the invention while also being used to form one or more full-depth features, at the same time.

FIG. 23 is a simplified cross-sectional view of a small portion of the photomask 1900 with the partial-depth producing chrome pattern 2104, and of a simplified cross-sectional view of a small portion of the wafer. The small portion of the wafer comprises only a small portion of the second polymer layer 412, which is preferably composed of photo-imageable polymer film 2301. The photo-imageable polymer film 2301 is shown after exposure to UV light, but prior to developing. A typical distance 2302 between the photomask 1900 and the polymer film 2301 is thirty-five (35) microns. The first polymer layer 404 (not shown in FIG. 23) is cured and is, therefore, not alterable by exposure to UV light. The second polymer layer 412, on the other hand, has not yet been cured and is alterable with UV light. A source (not shown) of UV light is reflected off a mirror 2303. For a particular aligner tool used, the mirror 2303 is a distance of three to five feet from the photomask. UV light directed from the mirror 2303 toward the photomask 1900, as indicated by arrows 2311–2319. The smaller dimension of the individual chrome lines 2101–2103 of the partial-depth producing chrome pattern 2104 shown in FIG. 23 is less than the critical dimension, i.e., the minimum dimension that the expose process is capable of resolving.

Where there is no chrome on the photomask 1900, the UV light passes through the photomask, as indicated by arrows 2311, 2313, 2314, 2316, 2317 and 2319, exposing portions of the second polymer layer 412. The polymer film is a negative-acting polymer film, and portions of the second polymer layer 412 that were exposed to UV light, which are indicated on FIG. 23 by solid-line hatch marks, become cross-linked. The exact area of the surface 2320 of the polymer layer 412 that is protected by a UV light shadow created by the chrome is less than the area of the chrome because some of the UV light undercuts, or passes under the edge of, the chrome 2101–2103. Some amount of UV light passes adjacent to the edges of the chrome 2101–2103 and is dispersed in various directions, including under the chrome, due to reflections within the second polymer layer 412. A small amount of UV light, as indicated, for example, by arrows 2313 and 2317, passes through the second polymer layer 412 and reflects off the first polymer layer 404 and back up at some angle, as shown in FIG. 23. Although not shown in FIG. 23, most of the reflected UV light passes through both the first and the second polymer layers and reflects off the silicon layer 402 and the RDL 406 in a manner analogous to arrows 2313 and 2317. Where there is chrome on the photomask 1900, the UV light is blocked, as indicated by arrows 2312, 2315 and 2318. The reflected UV light exposes areas in the second polymer layer 412 that are under the chrome 2101–2103, but close to the edge of the chrome. The portions 2321–2323 of the second polymer layer 412 that are not exposed, and, therefore, are not cross-linked are indicated by dashed-line hatch marks. The reflected UV light also exposes portions 2331–2333 in the second polymer layer 412 that are completely under the portions 2321–2323 that are not exposed.

FIG. 24 shows the small portion of the wafer of FIG. 23 after the wafer is processed with a developing chemical that removes all portions of the second polymer layer 412 not exposed by UV light passing through the one (1) micron spaces between the seven (7) micron chrome patterns on the photomask 1900. The portions 2321–2323 of the second polymer layer 412 that are shown with dashed-line hash marks in FIG. 23 are removed in FIG. 24.

In FIG. 24, the portions 2321–2323 of the second polymer layer 412 that are under the chrome 2101–2103 on the photomask 1900 are removed during developing. The photo-imageable polymer film does not cross-link in the portions 2321–2323 of the polymer film layer, i.e., in the polymer material that is near a surface 2320 closest to the photomask 1900, and, as a result, the portions are removed during developing. The amount of film thickness in the portions 2321–2323 that is not cross-linked during the exposure process is a function of the (a) the critical dimension used for the feature, (b) the exposure energy, (c) the depth of focus of the exposure tool, (d) the type of polymer exposed, and (e) the exposure tool used.

The developing process also plays a role in the amount of film thickness that is removed. The developing process is controlled by the (a) the developing solution used, (b) the temperature of the develop process, and (c) the amount of overdevelop that is done. The developing process also removes some thin, upper portions 2410 and 2411 of the second polymer layer 412 near the surface 2320, which were exposed by UV light. Although the portions 2410 and 2411 of the second polymer layer 412 had been exposed by UV light, have become cross-linked, and, as a result, are not greatly affected by the develop chemical, the resulting elevated material that would be expected to remain is well below the minimum, structurally sound, material width for the second polymer layer. It has been determined that the minimum, structurally sound, material width 2413 is somewhat controllable, and is between 1–6 microns. During the developing process, the thin, upper portions 2410 and 2411 of the second polymer layer 412 are removed, and only the thicker, lower portions 2420–2421 remain, which had been under the one (1) micron spaces between the chrome 2101–2104 of the photomask 1900.

Because the dimensions of the chrome patterns are pre-selected so that they are less than the minimum dimension that the expose process is capable of resolving, and because the spaces between the chrome are designed so that they are narrower than the minimum structurally sound line width for the second polymer layer 412, the expose/develop processes results in a partial-depth feature 2401 with some depth variation in the second polymer layer 412. The depth varies from a lesser depth 2415 to a greater depth 2416. The width 2417 of the partial-depth feature 2401 is approximately the cumulative widths of all the chrome 2101–2103 and spaces between the chrome, combined. Because of the type of exposure tool used, the thickness of the second polymer layer 412, the second polymer layer material type, and the expose/develop process parameters, the partial-depth feature 2401 has a smaller width 2418 at the bottom, which is farther from the photomask 1900. The partial-depth feature 2401 has angled sidewalls 2419 and 2420, and thus the width of the partial-depth feature decreases from top to bottom. The difference, or bias, is specific to the type of exposure tool used, the thickness of the second polymer layer 412, the type of polymer material, and the expose/develop process parameters used. Using alternate photolithography tools, materials, thicknesses or other parameters changes the difference between the diameter 2417 and the smaller diameter 2418.

FIGS. 7, 9 and 12–17 are examples of partial-depth moats created using closely spaced chrome patterns that individually are less than the critical dimension. The width of the partial-depth moats is greater than the critical dimension. Full-depth moats are created using a same photomask 1900 by preselecting a chrome segment having a smaller dimension that is larger than the critical dimension.

It is also possible to use closely spaced segments of chrome other than lines and circles, which have smaller dimensions are less than the critical dimension, to create partial-depth features of various depths and widths in a polymer layer 404 and 412. In such cases, the overall depth/width of the feature is a function of those items previously listed as relating to the expose/develop processes, as well as (a) the shape and size of the individual chrome segments, and (b) the spacing, or pitch, between the individual chrome segments. The individual closely spaced chrome segments have a cumulative effect during the exposure and developing processes resulting in a feature that is effectively one continuous structure whose width is an approximate sum of the widths of the individual chrome segments and the widths of the spaces therebetween used on the photomask 1900. Using the method in accordance with the invention, it is possible to create a full-depth and a partial-depth moat of many widths, the width being limited only by the particular design, e.g., the pitch between solder ball pads, with which the moats are used. The chrome on a prior art photomask used to make a full-depth feature has a size and shape that is substantially the same as a size and shape of the full-depth feature. On the other hand, the chrome on the photomask 1900 used to make the partial-depth feature 712 and 912 in accordance with the invention has a size and shape that is different from the size and shape of the partial-depth feature because spaces between the chrome also contribute to the size and shape of the partial-depth feature.

The polymer film has features, created in accordance with the invention, that show very little or no evidence of the shape of the chrome pattern of the photomask 1900 used to create the feature; alternatively, the polymer film has features where the shape of the chrome pattern is easily seen. Instead of being in the shape of a moat, the partial-depth feature can be in the shape of discernible information, including visually readable information. For example, a die 202 is marked, or inscribed, with a lot number using partial-depth features by using a photomask 1900 having the chrome pattern in the shape of the lot number.

An optical property of the surface of the second polymer layer 412 is changeable using the method in accordance with the invention. In particular, the reflectivity of the surface of the second polymer layer 412 is reduced by forming a multiplicity of partial-depth features in the polymer film, which is advantageous because reflections from the surface of a wafer-level CSP 200 could adversely affect robotic vision. It has been determined that forming a multiplicity of partial-depth features in the polymer film using a photomask 1900 with chrome lines having a width of 3–5 microns spaced ten (10) microns apart reduces the reflectivity of the polymer film and improves robotic vision There may be a need for various thicknesses of the second polymer layer 412 at different locations on the die 202 for a particular form, fit or sizing requirement. The thickness of the second polymer layer 412 is reducible using the method in accordance with the invention. First, the entire die 202 is covered with the second polymer layer 412. Then, the second polymer layer 412 is subjected to a photo-imaging process using the photomask 1900 that has partial-depth patterns on a portion corresponding to the portion of the polymer layer on the die 202 that needs thinning. After exposure and developing in accordance with the invention, the thickness of the polymer material on the portion of the second polymer layer 412 that was targeted is less than the thickness of the surrounding polymer material. Alternatively, the entire second polymer layer 412 of the die 202 is thinned in this manner. In either case, the partial-depth producing patterns on the photomask 1900 can be of almost any shape. It is advantageous to thin the polymer layer 214 in accordance with the invention rather than initially disposing less polymer, when it is necessary to thin the photo-imageable layer to a thickness that is less than a thickness that a photo-imageable coating process can achieve with a given material.

While the present invention has been described with respect to preferred embodiments thereof, such description is for illustrative purposes only, and is not to be construed as limiting the scope of the invention. Various modifications and changes may be made to the described embodiments by those skilled in the art without departing from the true spirit and scope of the invention as defined by the appended claims.

| LIST OF REFERENCE NUMERALS | |
|---|---|
| 100 | Prior Art Wafer-Level CSP |
| 102 | Prior Art Die |
| 106 | Prior Art Solder Ball Pads |
| 200 | Wafer-Level CSP |
| 202 | Die |
| 204 | Moats |
| 206 | Solder Ball Pad |
| 300 | Portion of Wafer |
| 308 | Solder Ball |
| 310 | Polymer Collar |
| 312 | Full-depth Moat |
| 313 | Diameter of Central Feature |
| 314 | Region within Moat |
| 315 | Width of Full-Depth Moat |
| 316 | Region without Moat |
| 317 | Distance |
| 402 | Silicon |
| 404 | First Polymer Layer |
| 406 | Re-Distribution Layer (RDL) |
| 412 | Second Polymer Layer |
| 414 | Central Feature |
| 416 | Diameter of Solder Ball |
| 502 | Residual |
| 701–703 | Lines |
| 712 | Partial-Depth Moat |
| 715 | Width of Partial-Depth Moat |
| 717 | Distance |
| 801 | Moat Depth |
| 901–904 | Rows |
| 912 | Partial-Depth Moat |
| 913 | Multiplicity of Circles |
| 915 | Width of Partial-Depth Moat |
| 917 | Distance |
| 1900 | Photomask |
| 1903 | Quartz |
| 1905 | Chrome |
| 2000 | Portion of the Photomask |
| 2002 | Central Chrome Circle |
| 2004 | Chrome Ring |
| 2006 | Diameter of Central Chrome Circle |
| 2008 | Width of Chrome Ring |
| 2010 | Diameter of Chrome Ring |
| 2100 | Portion of Photomask |
| 2101–2103 | Concentric Chrome Lines |
| 2104 | Partial-depth Producing Chrome Pattern |
| 2105 | Width of Each Concentric Chrome Line |
| 2106 | Width of Partial-depth Producing Pattern |
| 2107 | Diameter of Partial-depth Producing Chrome Pattern |
| 2200 | Portion of Photomask |
| 2201–2204 | Rings of Circles |
| 2205 | Partial-depth Producing Chrome Pattern |
| 2206 | Small Chrome Circles |
| 2207 | Width of Partial-depth Producing Chrome Pattern |
| 2300 | Cross-sectional View |

-continued

LIST OF REFERENCE NUMERALS

| | |
|---|---|
| 2301 | Polymer Film |
| 2302 | Distance |
| 2303 | Mirror |
| 2311–2319 | Arrows Representing UV Light |
| 2320 | Surface of Second Polymer Layer |
| 2321–2323 | Portions Not Exposed to UV Light |
| 2331–2333 | Portions Exposed to UV Light |
| 2400 | Cross-sectional View |
| 2401 | Partial-depth Feature |
| 2410–2411 | Upper Portions of Second Polymer Layer |
| 2413 | Minimum Structurally Sound Material Width |
| 2415 | Lesser Depth of Partial-depth Feature |
| 2416 | Greater Depth of Partial-depth Feature |
| 2417 | Width of Partial-depth Feature |
| 2418 | Smaller Width of Partial-depth Feature |
| 2419–2420 | Angled Side Walls of Partial-depth Feature |

We claim:

1. A photomask used to form a partial-depth feature in a polymer film on a semiconductor wafer, and, substantially simultaneously, used to form a full-depth feature in the polymer film on the semiconductor wafer during one series of photo-imaging steps using exposure tools capable of resolving a minimum resolvable size to form a feature completely through the polymer film, the polymer film having a film thickness, the partial-depth feature having a depth substantially less than the film thickness, the full-depth feature having a depth approximately equal to the film thickness, the photomask comprising:
 a transparent plate;
 at least one full-depth producing pattern, each full-depth producing pattern including an area of UV light-blocking material disposed on the transparent plate, the area having a larger dimension and a smaller dimension, the smaller dimension being equal to or greater than minimum resolvable size; and
 a partial-depth producing pattern including a plurality of areas of UV light-blocking material disposed on the transparent plate, each area of the plurality of areas having a larger dimension and a smaller dimension, the smaller dimension being less than the minimum resolvable size, each area being spaced from another area by a distance less than the minimum resolvable size.

2. The photomask of claim 1, in which the partial-depth producing pattern produces only one partial-depth feature in the polymer film.

3. The photomask of claim 2, in which each full-depth producing pattern produces a full-depth feature in the polymer film.

4. The photomask of claim 1, in which the partial-depth feature produced in the polymer film has a first width and in which the full-depth feature produced in the polymer film has a second width, and in which the second width is less than or equal to the first width.

5. The photomask of claim 1, in which the material of the transparent plate is one of glass and quartz.

6. The photomask of claim 1, in which the UV light-blocking material is chrome.

7. The photomask of claim 6, in which each area of the plurality of areas is a circle of chrome.

8. The photomask of claim 6, in which each area of the plurality of areas is a line of chrome.

9. A method of forming a partial-depth feature in a polymer film on a semiconductor wafer using exposure tools having a critical dimension, comprising the steps of:
 (a) disposing on a photomask a partial-depth producing pattern including a plurality of areas of UV light-blocking material, each area having a smaller dimension less than the critical dimension and being spaced apart a distance less than the critical dimension; and
 (b) exposing the polymer film to the partial-depth producing pattern on the photomask in a manner substantially the same as when exposing the polymer film to full-depth producing images on the photomask; and
 (c) developing the polymer film exposed to the partial-depth producing pattern on the photomask in a manner substantially the same as when developing the polymer film exposed to a full-depth producing pattern on the photomask.

10. The method of claim 9, in which the UV light-blocking material is chrome.

11. The method of claim 9, in which each area of the plurality of areas is a circle of chrome.

12. The method of claim 9, in which each area of the plurality of areas is a line of chrome.

13. A method of altering an optical property of a surface of a polymer film, comprising the steps of:
 (a) disposing a layer of polymer film on a semiconductor wafer, the layer having a surface with a first optical property;
 (b) exposing the polymer film to a partial-depth producing pattern on a photomask; and
 (c) developing the exposed polymer film such that the surface of the polymer film has a second optical property.

14. The method of claim 13, in which the optical property is reflectivity.

15. The method of claim 14, in which the reflectivity is reduced.

16. The method of claim 15, in which the partial-depth producing pattern includes chrome disposed on the photomask.

17. A method to inscribe markings on a surface of a polymer film, comprising the steps of:
 (a) disposing a layer of polymer film on a semiconductor wafer, the layer having a surface with no discernable markings;
 (b) exposing the polymer film to a partial-depth producing pattern on a photomask, the partial-depth producing pattern having one or more preselected shapes; and
 (c) developing the exposed polymer film such that the one or more preselected shapes are discernable on the surface of the polymer film.

18. The method of claim 17, in which the markings include alphanumerical information.

19. The method of claim 18, in which the partial-depth producing pattern includes chrome disposed on the photomask.

20. The method of claim 19, in which the chrome is disposed on the photomask in the preselected shape.

21. A method of making thinner a layer of a polymer film disposed on a semiconductor wafer, comprising the steps of:
 (a) providing a layer of polymer film on the semiconductor wafer, the layer having a first thickness;
 (b) exposing at least a portion of the polymer film to a partial-depth producing pattern on at least a portion of a photomask; and
 (c) developing the polymer film such that the at least a portion of the polymer film exposed to the partial-depth producing pattern has a second thickness, the second thickness being smaller than the first thickness.

22. The method of claim 21, in which the partial-depth producing pattern includes chrome disposed on the photomask.

23. The method of claim 22, in which step (b) exposes the entire polymer film to the partial-depth producing pattern on the photomask.

24. A method of using a photomask to form a feature in a layer of a negative-acting photo-imageable polymer film, the feature having a smaller dimension greater than a critical dimension of photolithography tools used, and in which the feature penetrates only partially through the layer, the polymer film having a minimum structurally sound material width, comprising the steps of:

(a) disposing on the photomask a plurality of areas of chrome, each area having a smaller dimension smaller than the critical dimension and being spaced apart a distance smaller than the critical dimension;

(b) exposing the polymer film to UV light shining through the photomask such that the UV light is blocked by the areas of chrome; and (c) developing the polymer film such that portions of the polymer film not exposed to the UV light and portions of the polymer film exposed to the UV light and having a width narrower than the minimum structurally sound material width, are removed, thereby forming the feature.

25. The method of claim 24, in which layer has a thickness and in which the feature penetrates a depth into the layer of 1–99% of the thickness.

26. The method of claim 24, in which the layer of polymer film is a passivation layer of a chip scale package.

* * * * *